United States Patent
Choi et al.

(10) Patent No.: US 9,338,887 B2
(45) Date of Patent: May 10, 2016

(54) CORE SUBSTRATE, MANUFACTURING METHOD THEREOF, AND STRUCTURE FOR METAL VIA

(71) Applicant: SAMSUNG ELECTRO-MECHANICS CO., LTD., Suwon (KR)

(72) Inventors: Jae Hoon Choi, Yongin (KR); Jong Kuk Hong, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 136 days.

(21) Appl. No.: 14/022,813

(22) Filed: Sep. 10, 2013

(65) Prior Publication Data

US 2014/0102770 A1 Apr. 17, 2014

(30) Foreign Application Priority Data

Oct. 16, 2012 (KR) .................... 10-2012-0114669

(51) Int. Cl.
| | |
|---|---|
| H05K 1/11 | (2006.01) |
| H05K 3/44 | (2006.01) |
| H05K 1/02 | (2006.01) |
| H05K 3/00 | (2006.01) |
| H05K 3/40 | (2006.01) |

(52) U.S. Cl.
CPC .............. *H05K 1/115* (2013.01); *H05K 1/0206* (2013.01); *H05K 3/445* (2013.01); *H05K 3/0014* (2013.01); *H05K 3/4046* (2013.01); *H05K 2201/09854* (2013.01); *H05K 2203/0369* (2013.01); *H05K 2203/1476* (2013.01)

(58) Field of Classification Search
USPC ........................................... 174/262
See application file for complete search history.

(56) References Cited

U.S. PATENT DOCUMENTS

| | | | | |
|---|---|---|---|---|
| 5,326,643 | A | * | 7/1994 | Adamopoulos et al. .... 428/472.2 |
| 5,744,758 | A | * | 4/1998 | Takenouchi et al. .......... 174/255 |
| 6,976,415 | B2 | | 12/2005 | Suzuki |
| 7,253,512 | B2 | * | 8/2007 | Powell .......................... 257/686 |
| 7,548,430 | B1 | * | 6/2009 | Huemoeller et al. .......... 361/760 |
| 2001/0020548 | A1 | * | 9/2001 | Burgess ........................ 174/262 |
| 2002/0106516 | A1 | * | 8/2002 | Sato et al. ..................... 428/413 |
| 2002/0131229 | A1 | * | 9/2002 | Jones et al. ................... 361/262 |
| 2002/0160219 | A1 | * | 10/2002 | Brenneman et al. .......... 428/626 |
| 2003/0137056 | A1 | * | 7/2003 | Taniguchi et al. ............. 257/774 |
| 2003/0155653 | A1 | * | 8/2003 | Iijima et al. ................... 257/758 |
| 2005/0150666 | A1 | * | 7/2005 | Holl et al. ......................... 172/1 |
| 2005/0153059 | A1 | * | 7/2005 | Wakizaka .................... 427/96.1 |
| 2006/0131176 | A1 | * | 6/2006 | Hsu ................................ 205/125 |
| 2007/0185297 | A1 | * | 8/2007 | Tanaka et al. .................. 528/10 |
| 2009/0090926 | A1 | * | 4/2009 | Wang et al. ..................... 257/99 |
| 2010/0089632 | A1 | * | 4/2010 | Ikeda ............................ 174/262 |

FOREIGN PATENT DOCUMENTS

| | | | |
|---|---|---|---|
| JP | 2005-064203 | * | 3/2005 |
| JP | 2006-073589 | | 3/2006 |

* cited by examiner

*Primary Examiner* — Michael F McAllister
(74) *Attorney, Agent, or Firm* — NSIP Law (57) ABSTRACT

The present invention relates to a core substrate, a manufacturing method thereof, and a structure for a metal via. In accordance with an embodiment of the present invention, a core substrate including: an insulation layer; a plurality of metal vias passing through the insulation layer and formed to become wider from upper and lower surfaces to a middle part of the insulation layer; and a conductive layer formed on the upper and lower surfaces of the insulation layer and connected to the plurality of metal vias. Further, a manufacturing method thereof and a structure for a metal via are provided.

12 Claims, 5 Drawing Sheets

- PRIOR ART -

FIG. 3B

- PRIOR ART -

FIG. 3C

- PRIOR ART -

FIG. 3D

- PRIOR ART -

FIG. 3E

- PRIOR ART -

FIG. 3F

- PRIOR ART -

FIG. 3G

- PRIOR ART -

FIG. 3H

- PRIOR ART -

FIG. 3I

- PRIOR ART -

FIG. 4A

- PRIOR ART -

FIG. 4B

- PRIOR ART -

CORE SUBSTRATE, MANUFACTURING METHOD THEREOF, AND STRUCTURE FOR METAL VIA

CROSS-REFERENCE TO RELATED APPLICATIONS

This application claims the foreign priority benefit under 35 U.S.C. Section 119 of Korean Patent Application Serial No, 10-2012-0114669, filed Oct. 16, 2012, which is hereby incorporated by reference in its entirety into this application.

BACKGROUND OF THE INVENTION

1. Field of the Invention

The present invention relates to a core substrate, a manufacturing method thereof, and a structure for a metal via, and more particularly, to a core substrate with a metal via having a new structure, which has no need to process a clearance area and two kinds of holes, that is, a through hole and a buried via hole in a metal layer when manufacturing a core substrate, a manufacturing method thereof, and a structure for a metal via.

2. Description of the Related Art

In line with miniaturization, densification, and thinning of electronic components, studies on thinning and high functions of semiconductor package substrates are in active progress. In recent times, heat generation is becoming a serious problem due to an increase in operation speed according to high performance of chips. The most common method to meet these requirements is a technique of manufacturing a metal core substrate by inserting metal such as copper (Cu), aluminum (Al), or invar having high thermal conductivity in a core of a substrate. In case of such metal, since it has very excellent thermal expansion and thermal conductivity characteristics, it is possible to suppress thermal expansion behavior of the substrate and perform a heat radiation function at the same time.

Figure 3A:
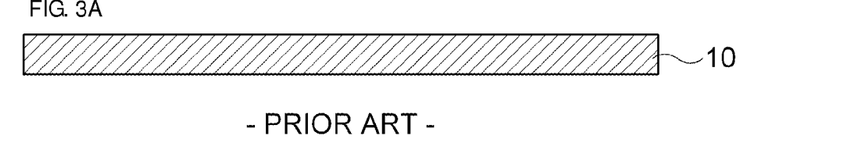
FIGS. 3a to 3i are views schematically showing each step of a conventional method for manufacturing a core substrate.
Figure 3B:
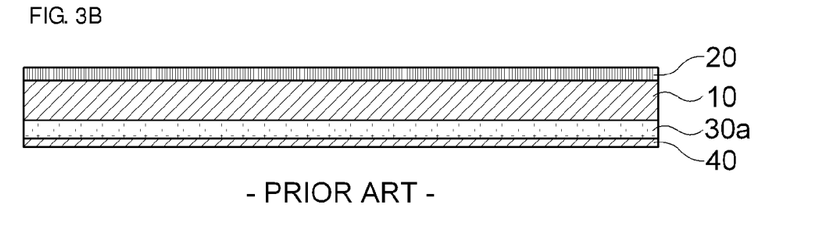
Figure 3C:
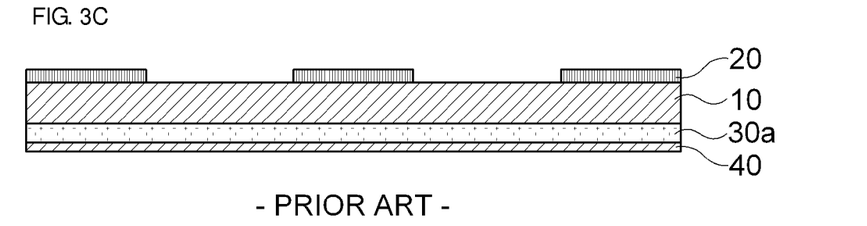
Figure 3D:
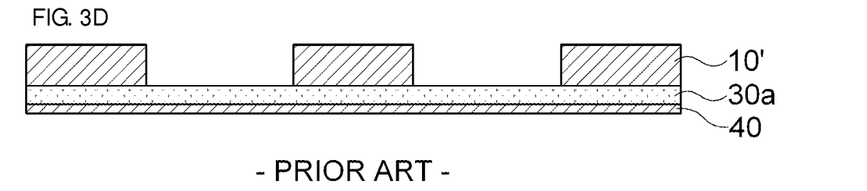
Figure 3E:
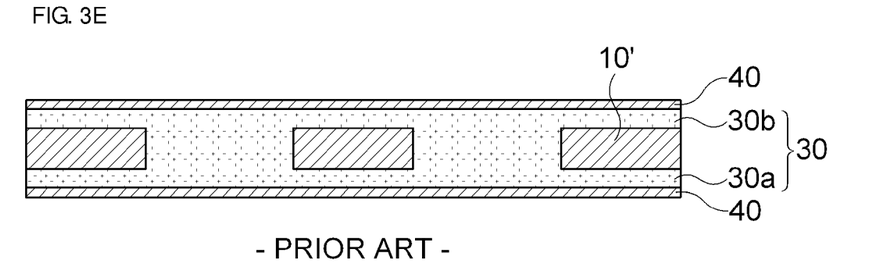
Figure 3F:
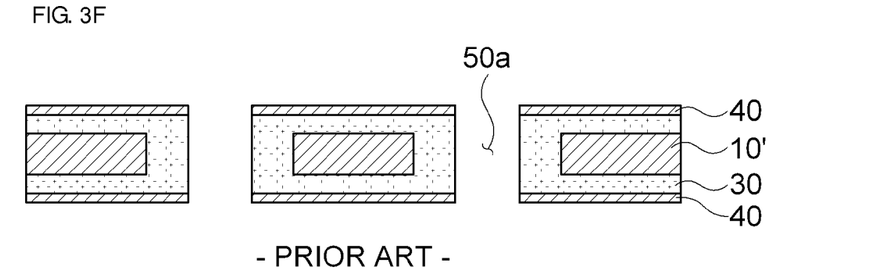
Figure 3G:
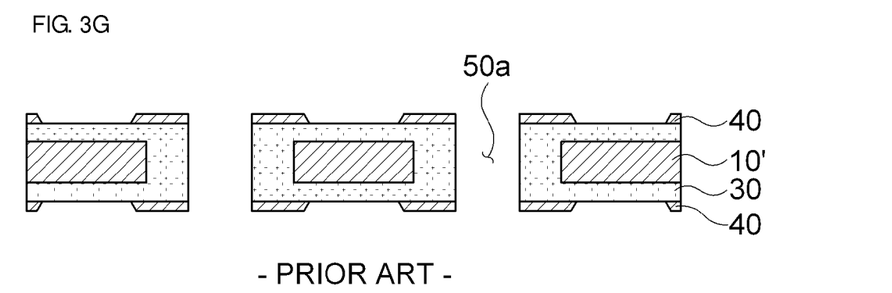
Figure 3H:
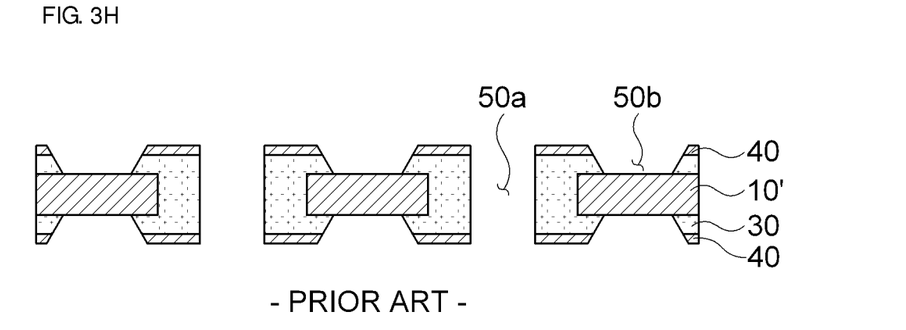
Figure 3I:
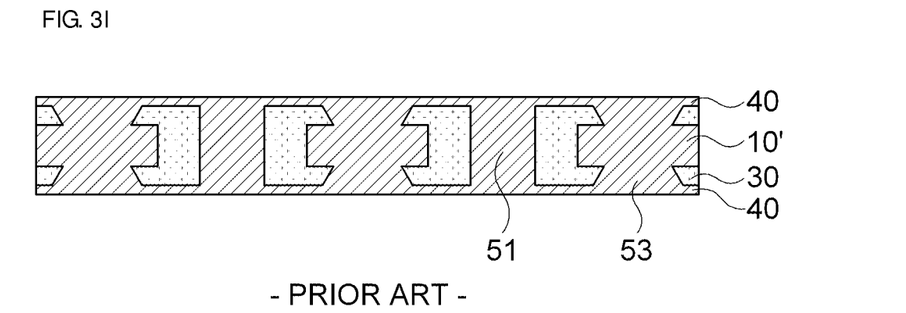
Figure 4A:
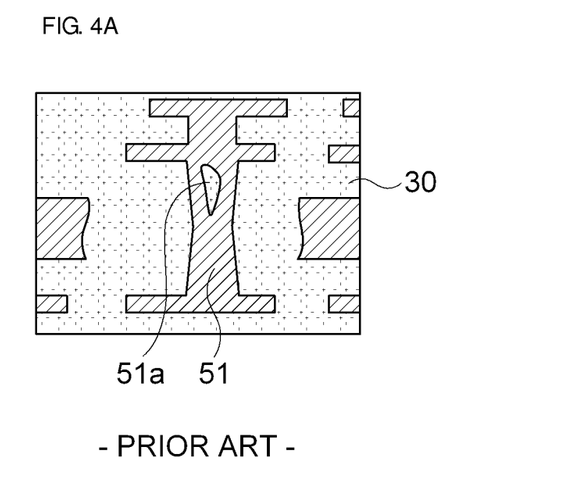
FIG. 4a is a view showing a through hole of a core substrate manufactured in accordance with the conventional method for manufacturing a core substrate.
Figure 4B:
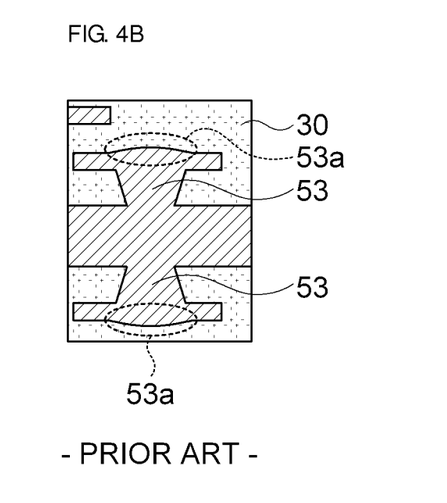
FIG. 4b is a view schematically showing a buried via of the core substrate manufactured in accordance with the conventional method for manufacturing a core substrate.

FIGS. 3a to 3j schematically show each step of a conventional method for manufacturing a core substrate, FIG. 4a shows a through hole of a core substrate manufactured according to the conventional manufacturing method, and FIG. 4b schematically shows a buried via of the core substrate manufactured according to the conventional manufacturing method.

In the prior art, in order to improve performance of thermal conductivity, it is required to form a thermal via hole 53 connected to a metal layer 10 or a ground layer inserted as an intermediate layer of a core substrate. In this case, a process of forming the thermal via hole 53 connected to the ground layer and a process of forming a through hole 51 having an electrical signal of connecting upper and lower parts of the substrate are performed separately. Further, since the holes have different shapes, a SEAM void 51a or a dimple 53a occurs during plating and becomes more serious when a thickness of the core layer 10 is increased.

Describing the conventional process of manufacturing a core substrate, when applying copper (Cu) as the metal layer 10 of FIG. 3a, as shown in FIG. 3b, the metal layer 10 and an insulator 30a are attached through primary lamination. At this time, a copper foil layer 40 may be attached to an outer side of the insulator 30a, and photoresist 20 may be attached onto the metal layer 10 to form a clearance for processing a through hole 50a. When forming the hole 53 having connection with the metal layer 10' and the hole 51 without connection with the metal layer 10', since the hole 51 having electrical connection is not connected to the metal layer 10', it is required to form a clearance. Due to this, a resist pattern 20 is formed by exposing the photoresist 20 on the metal layer 10 in FIG. 3c, and a clearance area is formed using a drill or etching in FIG. 3d. A metal layer pattern 10' is formed according to the formation of the clearance area. After that, after performing black oxide or brown oxide treatment as in FIG. 3e, a copper clad laminate CCL having a three-layer substrate structure, which has a metal core 10', is manufactured by laminating and pressing an insulation layer 30b and the copper foil 40.

Further, as in FIG. 3f, when processing the through hole 50a having electrical connection for interlayer connection, the hole 50a is formed by CNC processing or direct CO2 processing. Further, as in FIG. 3h, since the hole 50b connected to the metal core layer 10' due to heat radiation characteristics has difficulty in CNC processing or direct CO2 processing due to the metal core layer 10', general CO2 processing is used to make a buried via hole (BVH) type hole. As shown in FIG. 3i, in case of filling plating for the hole after processing the hole, since the holes have two kinds of shapes, that is, the through hole 51 and the BVH 53, it is not easy to set plating conditions, and when performing pattern plating, it is difficult to proceed a process in stack type.

That is, in case of using the conventional method, when forming the hole 53 connected to the metal core layer 10' and the hole 51 unconnected to the metal core layer 10', it is difficult to design the hole 53 connected to the metal core layer 10' or the number of processes is increased due to two kinds of processing and thus process time is also increased.

Further, as shown in FIGS. 4a and 4b, since the through hole 51 and the BVH 53 should be plated at the same time, plating failures such as the SEAM void 51a and the dimple 53a may occur.

RELATED ART DOCUMENT

[Patent Document]
Patent Document 1: U.S. Patent Laid-open Publication No. U.S. Pat. No. 6,976,415 B2 (laid-open on Dec. 20, 2005)

SUMMARY OF THE INVENTION

The present invention has been invented in order to overcome the above-described problems and it is, therefore, an object of the present invention to provide a core substrate with a metal via having a new structure, which has no need to process a clearance area and two kinds of holes, that is, a through hole and a buried via hole in a metal layer when manufacturing a core substrate.

In accordance with a first embodiment of the present invention to achieve the object, there is provided a core substrate including: an insulation layer; a plurality of metal vias passing through the insulation layer and formed to become wider from upper and lower surfaces to a middle part of the insulation layer; and a conductive layer formed on the upper and lower surfaces of the insulation layer and connected to the plurality of metal vias.

In this case, in an example, the metal via may have a structure in which a cross-sectional trapezoidal shape of an upper part and a cross-sectional inverted trapezoidal shape of a lower part are combined, wherein the cross-sectional trapezoidal shape and the cross-sectional inverted trapezoidal shape may have a symmetric or asymmetric structure.

Further, in accordance with an example, the metal via and the conductive layer may be made of a copper material.

In accordance with another example, some of the plurality of metal vias may be used as through holes for electrically connecting circuit patterns which are to be formed on upper and lower surfaces of the core substrate and some or all of the rest may be used as thermal via holes.

Next, in accordance with a second embodiment of the present invention to achieve the object, there is provided a method for manufacturing a core substrate including the steps of: forming a structure for a metal via, which consists of a plurality of via bodies becoming wider from upper and lower surfaces to a middle part and a connection plate for connecting the middle parts of the plurality of via bodies, by etching both surfaces of a metal layer; forming a plurality of metal vias by laminating an insulation layer under the structure for a metal via and performing etching on an upper side to remove the connection plate; and forming a core substrate by laminating an insulation layer on the lower insulation layer laminate from which the connection plate is removed.

In this case, in an example, the step of forming the structure for a metal via may include the steps of forming resist patterns on upper and lower surfaces of the metal layer; and forming the plurality of via bodies and the connection plate by etching the both surfaces of the metal layer on which the resist patterns are formed.

Further, in accordance with an example, in the step of forming the structure for a metal via, the both surfaces of the metal layer may be etched so that the via body has a shape in which a cross-sectional trapezoidal shape of an upper part and a cross-sectional inverted trapezoidal shape of a lower part are combined.

In this case, in another example, a width of the cross-sectional trapezoidal shape may be larger than that of the cross-sectional inverted trapezoidal shape.

Further, in another example, the cross-sectional trapezoidal shape and the cross-sectional inverted trapezoidal shape may be symmetric to each other.

Further, in an example, the step of forming the plurality of metal vias may include the steps of laminating the insulation layer under the structure for a metal via; and forming the plurality of metal vias by forming a resist layer on an upper surface of the via body of the structure for a metal via under which the insulation layer is laminated and etching the resist layer to remove the connection plate.

In accordance with another example, the step of forming the core substrate may include the steps of forming an upper and lower insulation layer laminate by laminating the insulation layer on the lower insulation layer laminate from which the connection plate is removed; polishing upper and lower surfaces of the upper and lower insulation layer laminate to expose upper and lower surfaces of the plurality of metal vias; and forming a conductive layer on the upper and lower surfaces of the polished laminate.

In this case, in another example, in the step of forming the conductive layer, the conductive layer may be coated by one of sputtering, electroplating, and electroless plating.

Next, in accordance with a third embodiment of the present invention to achieve the object, there is provided a structure for a metal via, which forms a metal via when manufacturing a core substrate, including: a plurality of via bodies having a shape becoming wider from upper and lower surfaces to a middle part; and a connection plate for connecting the upper and lower middle parts of the via bodies.

In this case, in an example, the via body may have a shape formed by combining a cross-sectional trapezoidal shape of an upper part and a cross-sectional inverted trapezoidal shape of a lower part.

In this case, the cross-sectional trapezoidal shape and the cross-sectional inverted trapezoidal shape may have a symmetric or asymmetric structure.

Further, in accordance with an example, the structure for a metal via may be made of a copper material.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Embodiments of the present invention to achieve the above-described objects will be described with reference to the accompanying drawings. In this description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other elements or combination thereof.

The drawings referenced in this specification are provided as examples to describe the embodiments of the present invention, and the shape, the size, and the thickness may be exaggerated in the drawings for effective description of technical features.

First, a core substrate in accordance with an embodiment of the present invention will be specifically described with reference to the drawings. At this time, the reference numeral that is not mentioned in the reference drawing may be the reference numeral that represents the same element in another drawing.

Figure 1A:
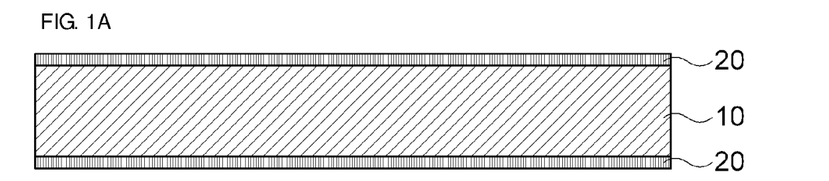
FIGS. 1a to 1h are views schematically showing each step of a method for manufacturing a core substrate in accordance with an embodiment of the present invention.
Figure 1B:
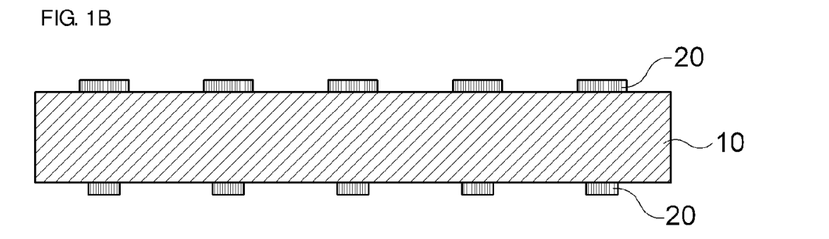
Figure 1C:
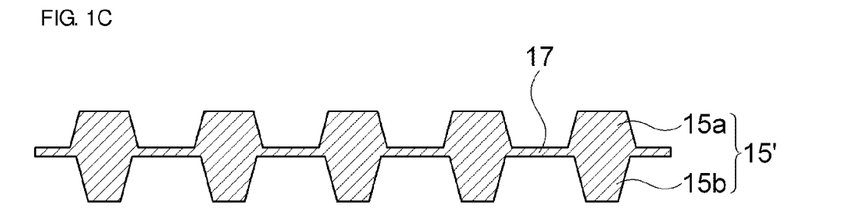
Figure 1D:
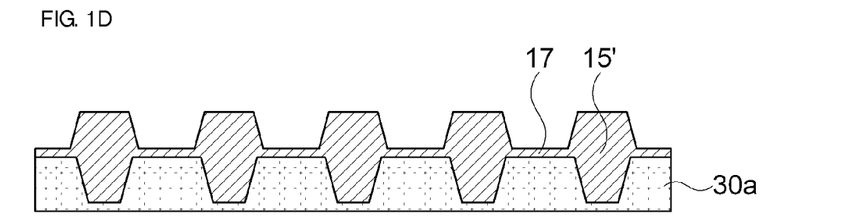
Figure 1E:
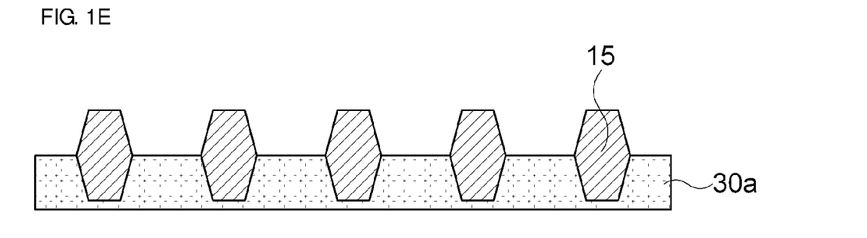
Figure 1F:
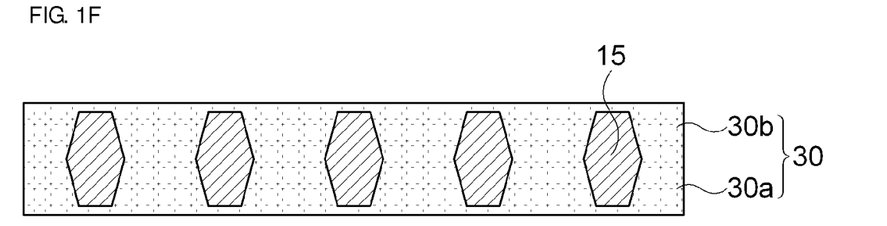
Figure 1G:
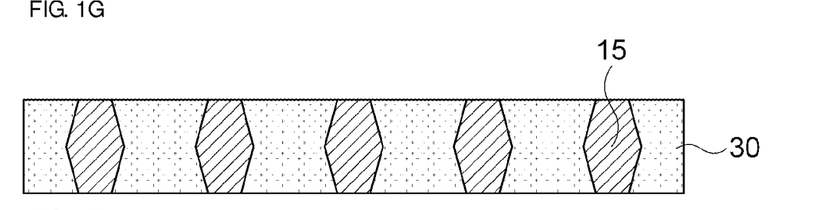
Figure 1H:
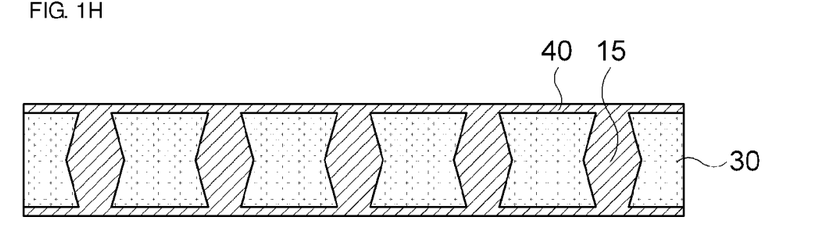

FIG. 1h is a view schematically showing a core substrate in accordance with an embodiment of the present invention.

Referring to FIG. 1h, a core substrate in accordance with an example includes an insulation layer 30, a plurality of metal vias 15, and a conductive layer 40.

In this case, the insulation layer 30 of the core substrate may be made of a well-known insulating material used in substrates.

Next, referring to FIG. 1h, the plurality of metal vias 15 pass through the insulation layer 30. At this time, each metal via 15 is formed to become wider from upper and lower surfaces to a middle part of the insulation layer 30. At this time, the metal via 15 may be made of a copper material but not limited thereto. For example, the metal via 15 may be made of Cu/Invar/Cu (CIC) or Cu/Aluminum/Cu (CAC). Upper and lower parts of the metal via 15 may be made of Cu, and a middle part thereof may be made of an invar alloy or an aluminum material. A method for forming the metal via 15 will be specifically described in a method for manufacturing a core substrate in accordance with the next second embodiment.

For example, referring to 1h, in an example, the metal via 15 may have a structure in which a cross-sectional trapezoidal shape of an upper part and a cross-sectional inverted trapezoidal shape of a lower part are combined. For example, the metal via 15 may have a hexagonal shape formed long in the vertical direction. Further, at this time, the cross-sectional trapezoidal shape of the upper part and the cross-sectional inverted trapezoidal shape of the lower part may have a symmetric or asymmetric structure.

Further, in accordance with an example, some of the plurality of metal vias 15 may be used as through holes for electrically connecting circuit patterns which are to be formed on upper and lower surfaces of the core substrate. Further, some or all of the rest may be used as thermal via holes connected to circuit patterns which are to be formed on an upper or lower surface of the plurality of metal vias 15. For example, the plurality of metal vias 15 may be regularly formed in large quantities, and it is possible to improve thermal conductivity by using some of them as through holes and most of the rest as thermal via holes.

Continuously, referring to FIG. 1h, the conductive layer 40 of the core substrate is formed on the upper and lower surfaces of the insulation layer 30 and connected to the plurality of metal vias 15. For example, the conductive layer 40 may be a copper material, for example, a copper foil layer but not limited thereto. A method of forming the conductive layer 40 will be specifically described in the method for manufacturing a core substrate in accordance with the next second embodiment.

Next, a method for manufacturing a core substrate in accordance with a second embodiment of the present invention will be specifically described with reference to the drawings. At this time, the core substrate in accordance with the first embodiment described above will be referenced. Thus, repeated descriptions may be omitted.

FIGS. 1a to 1h are views schematically showing each step of a method for manufacturing a core substrate in accordance with an embodiment of the present invention.

Referring to FIGS. 1a to 1h, a method for manufacturing a core substrate in accordance with an example includes the steps of forming a structure for a metal via (refer to FIGS. 1a to 1c), forming a metal via (refer to FIGS. 1d and 1e), and forming a core substrate (refer to FIG. 1f to 1h). Each step will be more specifically described.

First, referring to FIGS. 1a to 1c and FIG. 2, in the step of forming the structure for a metal via, the structure for a metal via, which consists of a plurality of via bodies 15' and 15" becoming wider from upper and lower surfaces to a middle part and a connection plate 17 for connecting the middle parts of the plurality of via bodies 15' and 15", is formed by etching both surfaces of a metal layer 10. At this time, the metal layer 10, which forms the structure for a metal via, may be made of a copper material but not limited thereto. At this time, the connection plate 17 is formed by etching the both surfaces of the metal layer 10 only to a middle part of the metal layer 10 to leave a plate in the middle part, not etching the both surfaces of the metal layer 10 to allow the both surfaces to pass through each other when etching the both surfaces of the metal layer 10.

Specifically describing with reference to FIGS. 1a to 1c, in an example, the step of forming the structure for a metal via may include the steps of forming a resist pattern (refer to FIGS. 1a and 1b) and etching the both surfaces (refer to FIG. 1c). Referring to FIGS. 1a and 1b, in the step of forming the resist pattern, resist patterns 20 are formed on the upper and lower surfaces of the metal layer 10. For example, the resist patterns 20 may be formed through an exposure process after applying photoresist 20 on the upper and lower surfaces of the metal layer 10 (refer to FIG. 1b). Further, referring to FIG. 1c, in the step of etching the both surfaces, the plurality of via bodies 15' and the connection plate 17 are formed by etching the both surfaces of the metal layer 10 on which the resist patterns 20 are formed.

Figure 2:
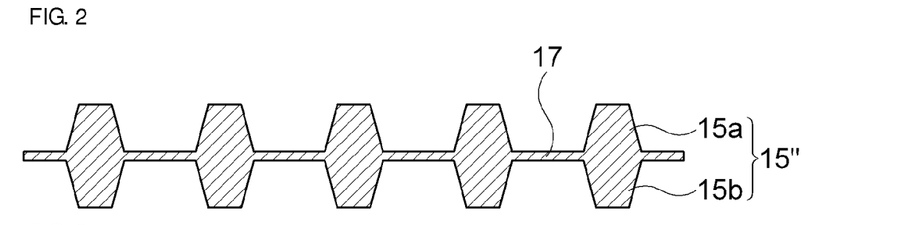
FIG. 2 is a view schematically showing a structure for a metal via in accordance with another embodiment of the present invention.

In this case, referring to FIGS. 1c and/or 2, in an example, in the step of forming the structure for a metal via, the both surfaces of the metal layer 10 may be etched so that the via bodies 15' and 15" have a shape formed by combining a cross-sectional trapezoidal shape of an upper part 15a and a cross-sectional inverted trapezoidal shape of a lower part 15b.

For example, referring to FIG. 1c, the via body 15' may be formed so that a width of the cross-sectional trapezoidal shape of the upper part 15a is larger than that of the cross-sectional inverted trapezoidal shape of the lower part 15b. Accordingly, for example, although a portion of a slope of the upper part of the via body 15' as well as the connection plate 17 is etched during secondary etching in a subsequent process, upper and lower parts of a metal via 15 can be formed symmetrically or nearly symmetrically.

Otherwise, referring to FIG. 2, in another example, the cross-sectional trapezoidal shape of the upper part 15a and the cross-sectional inverted trapezoidal shape of the lower part 15b of the via body 15" may be symmetric or substantially symmetric to each other.

Next, referring to FIGS. 1d and 1e, in the step of forming the metal via, a plurality of metal vias 15 are formed by laminating an insulation layer 30a under the structure for a metal via and performing etching on an upper side to remove the connection plate 17.

For example, in this case, in accordance with an example, the step of forming the metal via may include the steps of laminating the lower insulation layer (refer to FIG. 1d) and removing the connection plate (refer to 1e). Referring to FIG. 1d, in the step of laminating the lower insulation layer, the insulation layer 30a is laminated under the structure for a metal via. For example, the insulation layer 30a may be laminated after performing anodizing, for example, black oxide or brown oxide treatment, under the structure for a metal via. At this time, a lower insulation layer laminate, which is a primary laminate, may be formed by pressing the insulation layer 30a laminated under the structure for a metal via, for example, using a press. Further, referring to FIG. 1e, in the step of removing the connection plate, the plurality of metal vias 15 may be formed by forming a resist layer (not shown) on an upper surface of the via body 15' of the structure for a metal via under which the insulation layer 30a is laminated and performing etching to remove the connection plate 17. For example, etching may be performed after applying a resist solution on the upper surface of the via body 15' and 15"

of the structure for a metal via and drying the applied solution or forming a resist dry film pattern. At this time, when resist (not shown) is coated only on the upper surface of the via body 15' and 15", a portion of the slope of the upper part of the via body 15' and 15" as well as the connection plate 17 may be etched when etching the upper side of the via body 15' and 15". The lower insulation layer laminate, from which the connection plate 17 is removed, may be formed by etching the upper side of the primary laminate formed by laminating the lower insulation layer 30a to remove the connection plate 17.

Next, referring to FIGS. 1f to 1h, in the step of forming the core substrate, the core substrate is formed by laminating an insulation layer 30b on the lower insulation layer laminate from which the connection plate 17 is removed.

Specifically, referring to FIGS. 1f to 1h, in an example, the step of forming the core substrate may include the steps of laminating an upper insulation layer (refer to FIG. 1f), surface polishing (refer to FIG. 1g), and forming a conductive layer (refer to FIG. 1h).

Referring to FIG. 1f, in the step of laminating the upper insulation layer, an upper and lower insulation layer laminate is formed by laminating an insulation layer 30 on the lower insulation layer laminate from which the connection plate 17 is removed. At this time, the upper insulation layer 30b may be made of the same material as the lower insulation layer 30a, or a different material having high adhesion with the lower insulation layer 30a or a different insulating material having a different CTE or modulus property may be used. For example, the upper and lower insulation layer laminate, which is a secondary laminate, may be formed by laminating the insulation layer 30b after performing anodizing, for example, black oxide or brown oxide treatment, on the lower insulation layer laminate from which the connection plate 17 is removed and pressing the laminated insulation layer 30b using a press.

Next, referring to FIG. 1g, in the step of surface polishing, upper and lower surfaces of the upper and lower insulating laminate are polished to expose the upper and lower surfaces of the plurality of metal vias 15. After the polishing step, the surface of the metal via 15 is exposed outside the laminate.

Next, referring to FIG. 1h, in the step of forming the conductive layer, the conductive layer 40 is formed on the upper and lower surfaces of the polished laminate. The conductive layer 40 may be made of a copper material, for example, a copper foil layer.

For example, in an example, in the step of forming the conductive layer, the conductive layer may be coated by one of sputtering, electroplating, and electroless plating.

For example, a core substrate manufactured through the above-described processes may be manufactured by forming a circuit pattern on the conductive layer 40 or performing PSR and/or surface treatment and routing after laminating an additional insulation layer and forming a circuit pattern.

In accordance with the embodiments of the present invention, holes formed as the metal vias 15 having a new structure may be formed using the structure for a metal via shown in FIGS. 1c and/or 2 without processing two kinds of holes, that is, a buried via hole (BVH) 53 and a through hole 51 by forming a clearance in a metal layer 10 as shown in FIGS. 3a to 3i when manufacturing a core substrate. For example, in this case, it is possible to improve thermal conductivity by using some of the plurality of metal vias 15 as through holes and most of the rest as thermal via holes.

Next, a structure for a metal via in accordance with a third embodiment of the present invention will be specifically described with reference to the drawings. At this time, the above-described first and second embodiments may be referenced. Thus, repeated descriptions may be omitted.

FIG. 1c schematically shows a structure for a metal via in accordance with an embodiment of the present invention, and FIG. 2 schematically shows a structure for a metal via in accordance with another embodiment of the present invention.

Referring to FIGS. 1c and/or 2, a structure for a metal via in accordance with an example includes a plurality of via bodies 15' and 15" and a connection plate 17. At this time, the structure for a metal via forms a metal via 15 by removing the connection plate 17 when manufacturing a core substrate.

In this case, in accordance with an example, the structure for a metal via may be made of a copper material but not limited thereto.

Referring to FIGS. 1c and/or 2, the via body 15' and 15" may have a shape becoming wider from upper and lower surfaces to a middle part. For example, in an example, the via body 15' and 15" may have a shape formed by combining a cross-sectional trapezoidal shape of an upper part 15a and a cross-sectional inverted trapezoidal shape of a lower part 15b.

In this case, referring to FIGS. 1c and/or 2, the cross-sectional trapezoidal shape of the upper part 15a and the cross-sectional inverted trapezoidal shape of the lower part 15b may be symmetric or asymmetric to each other.

Next, referring to FIGS. 1c and/or 2, the connection plate 17 connects the middle parts of the plurality of via bodies 15' and 15". For example, the structure for a metal body may have a shape in which the plurality of via bodies 15' and 15" are stuck to the connection plate 17.

According to the embodiments described above, since the metal via 15 is formed using a new structure for a metal via and performs functions of conventional through hole and buried through hole, it is possible to exclude a conventional hole plating process and improve economical efficiency by removing processing costs. Further, it is possible to improve thermal conductivity by forming the metal vias in large quantities to use the metal vias 15 as thermal via holes.

According to the embodiment of the present invention, it is possible to manufacture a core substrate with a metal via having a new structure, which has no need to process a clearance area and two kinds of holes, that is, a through hole and a buried via hole in a metal layer when manufacturing the core substrate.

Further, according to the embodiment of the present invention, since a metal via is formed using a new structure for a metal via and used as a hole, it is possible to improve economical efficiency by excluding a conventional hole plating process and removing processing costs.

Further, according to an embodiment of the present invention, it is possible to improve thermal conductivity by forming metal vias in large quantities and using the metal vias as thermal via holes.

In addition, according to an example of the present invention, it is possible to overcome plating failures such as a void or/and a dimple occurring in a conventional process of plating a through hole and a BVH by forming a metal via, which forms a hole, using a structure for a metal via.

It is apparent that various effects which have not been directly mentioned according to the various embodiments of the present invention can be derived by those skilled in the art from various constructions according to the embodiments of the present invention.

The above-described embodiments and the accompanying drawings are provided as examples to help understanding of those skilled in the art, not limiting the scope of the present invention. Further, embodiments according to various combinations of the above-described components will be apparently implemented from the foregoing specific descriptions by those skilled in the art. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A core substrate comprising:
   an insulation layer;
   a plurality of metal vias passing through the insulation layer and formed to become wider from upper and lower surfaces to a middle part of the insulation layer; and
   a conductive layer formed on the upper and lower surfaces of the insulation layer and connected to the plurality of metal vias,
   wherein the plurality of metal vias each have an upper part and a lower part in direct contact with each other.

2. The core substrate according to claim 1, wherein the metal vias each have a structure in which a cross-sectional trapezoidal shape of the upper part and a cross-sectional inverted trapezoidal shape of the lower part are combined.

3. The core substrate according to claim 1, wherein the metal via and the conductive layer are made of a copper material.

4. The core substrate according to one of claim 1, wherein some of the plurality of metal vias are used as through holes for electrically connecting circuit patterns which are to be formed on upper and lower surfaces of the core substrate and some or all of the rest are used as thermal via holes.

5. A structure for a metal via, which is prefabricated to form a metal via when manufacturing a core substrate, comprising:
   a plurality of via bodies each having a shape becoming wider from upper and lower surfaces to a middle part; and
   a connection plate for connecting the upper and lower middle parts of the via bodies.

6. The structure for a metal via according to claim 5, wherein the via body has a shape formed by combining a cross-sectional trapezoidal shape of an upper part and a cross-sectional inverted trapezoidal shape of a lower part.

7. The structure for a metal via according to claim 6, wherein the cross-sectional trapezoidal shape and the cross-sectional inverted trapezoidal shape have a symmetric or asymmetric shape.

8. The structure for a metal via according to one of claim 5, wherein the structure for a metal via is made of a copper material.

9. The core substrate according to claim 2, wherein some of the plurality of metal vias are used as through holes for electrically connecting circuit patterns which are to be formed on upper and lower surfaces of the core substrate and some or all of the rest are used as thermal via holes.

10. The core substrate according to claim 3, wherein some of the plurality of metal vias are used as through holes for electrically connecting circuit patterns which are to be formed on upper and lower surfaces of the core substrate and some or all of the rest are used as thermal via holes.

11. The structure for a metal via according to claim 6, wherein the structure for the metal via is made of a copper material.

12. The structure for a metal via according to claim 7, wherein the structure for the metal via is made of a copper material.

* * * * *